(12) United States Patent
Lu et al.

(10) Patent No.: US 11,272,598 B2
(45) Date of Patent: Mar. 8, 2022

(54) TRANSCONDUCTANCE CIRCUITS AND METHODS

(71) Applicant: Analog Devices International Unlimited Company, Limerick (IE)

(72) Inventors: Ye Lu, Salem, NH (US); Jinhua Ni, Shanghai (CN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/816,917

(22) Filed: Mar. 12, 2020

(65) Prior Publication Data

US 2021/0251061 A1 Aug. 12, 2021

(30) Foreign Application Priority Data

Feb. 7, 2020 (WO) ................ PCT/CN2020/074465

(51) Int. Cl.
| | |
|---|---|
| H05B 45/395 | (2020.01) |
| H03F 1/02 | (2006.01) |
| H03F 3/45 | (2006.01) |
| H03F 1/26 | (2006.01) |
| H05B 45/14 | (2020.01) |
| H05B 45/44 | (2020.01) |
| H05B 45/10 | (2020.01) |

(52) U.S. Cl.
CPC ......... *H05B 45/395* (2020.01); *H03F 1/0233* (2013.01); *H03F 1/26* (2013.01); *H03F 3/45071* (2013.01); *H03F 2200/156* (2013.01)

(58) Field of Classification Search
CPC ...... H05B 45/37; H05B 45/10; H05B 45/395; H05B 45/50; H05B 45/00; H05B 45/38; H05B 45/44; H05B 45/48; H05B 41/2825; H05B 41/2822
USPC ............................................. 315/111.51, 224
See application file for complete search history.

(56) References Cited

U.S. PATENT DOCUMENTS

| | | | |
|---|---|---|---|
| 9,203,350 B2 | 12/2015 | Dempsey et al. | |
| 9,215,763 B2 | 12/2015 | Huang et al. | |
| 10,412,813 B1* | 9/2019 | Chen | H05B 45/10 |
| 2009/0302769 A1* | 12/2009 | Trattler | H05B 45/20 |
| | | | 315/152 |
| 2010/0164403 A1* | 7/2010 | Liu | H05B 45/347 |
| | | | 315/297 |
| 2013/0009621 A1* | 1/2013 | Chen | G05F 1/561 |
| | | | 323/282 |
| 2013/0049599 A1* | 2/2013 | Logiudice | H05B 45/48 |
| | | | 315/122 |
| 2013/0050288 A1* | 2/2013 | Kang | H05B 47/165 |
| | | | 345/690 |
| 2014/0210359 A1* | 7/2014 | Raval | H05B 47/10 |
| | | | 315/186 |

(Continued)

OTHER PUBLICATIONS

ADPD1080/ADPD1081 *Photometric Front Ends*, Analog Devices Data Sheet, 74 pages.

*Primary Examiner* — Wei (Victor) Y Chan
(74) *Attorney, Agent, or Firm* — Patent Capital Group

(57) ABSTRACT

Disclosed herein are transconductance circuits, as well as related methods and devices. In some embodiments, a transconductance circuit may include an amplifier having a first input coupled to a voltage input of the transconductance circuit, and a switch coupled between an output of the amplifier and a second input of the amplifier.

20 Claims, 3 Drawing Sheets

(56) References Cited

U.S. PATENT DOCUMENTS

| | | | | |
|---|---|---|---|---|
| 2014/0340150 A1* | 11/2014 | Dempsey | ................ | H03F 1/223 |
| | | | | 330/260 |
| 2015/0102742 A1* | 4/2015 | Deng | .................... | H05B 45/37 |
| | | | | 315/205 |
| 2015/0130361 A1* | 5/2015 | Zhang | .................. | H05B 45/397 |
| | | | | 315/186 |
| 2016/0360584 A1* | 12/2016 | Xie | ......................... | G09G 3/32 |
| 2018/0139816 A1* | 5/2018 | Liu | ....................... | H05B 45/10 |

* cited by examiner

US 11,272,598 B2

TRANSCONDUCTANCE CIRCUITS AND METHODS

CROSS-REFERENCE TO RELATED APPLICATION

This application claims the benefit of and priority from PCT Application No. PCT/CN2020/074465 filed Feb. 7, 2020, entitled, "TRANSCONDUCTANCE CIRCUITS AND METHODS," incorporated herein by reference in its entirety.

BACKGROUND

Transconductance circuits may receive a voltage as an input, and may generate a current as an output. Thus, a transconductance circuit may be considered a voltage-controlled current source.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
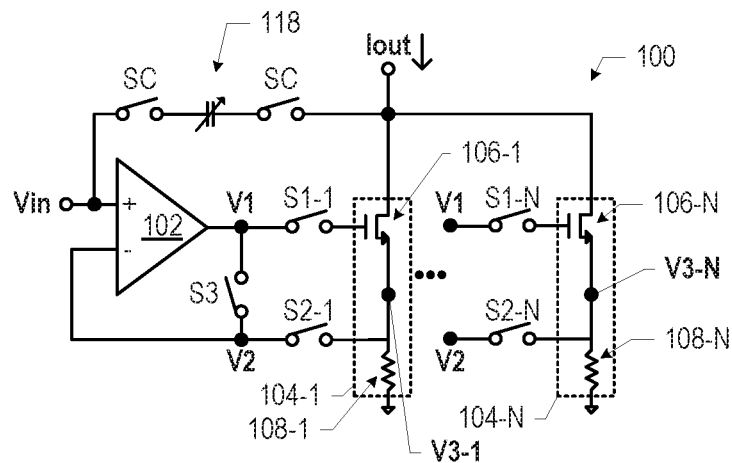
FIG. 1 is a schematic of an example transconductance circuit, in accordance with various embodiments.

Disclosed herein are transconductance circuits, as well as related methods and devices. In some embodiments, a transconductance circuit may include an amplifier having a first input coupled to a voltage input of the transconductance circuit, and a switch coupled between an output of the amplifier and a second input of the amplifier.

The transconductance circuits and related embodiments disclosed herein may provide a wide range of precision output currents while acquiring a smaller area and/or operating power relative to conventional approaches. The transconductance circuits may also be able to operate at low supply voltages, and may have a large drive capability (e.g., the ability to drive loads having a large inductance). Manufacturing of the transconductance circuits disclosed herein may be performed using readily available technologies. Current pulses generated by the transconductance circuits disclosed herein may be utilized in any suitable setting, such as to drive a light-emitting diode (LED) for optical vital signs measurement; such LEDs may have a large inductance, and thus LED-drive applications may particularly benefit from the transconductance circuits disclosed herein. Further, the transconductance circuits disclosed herein permit the simultaneous monitoring of output current and an output voltage correlated with the output current, allowing the cancellation or reduction of the correlated noise in an output signal. Various other advantages in further embodiments are discussed in detail below.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). For the purposes of the present disclosure, the phrase "A or B" means (A), (B), or (A and B).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

FIG. 1 is a schematic of an example transconductance circuit 100, in accordance with various embodiments. The transconductance circuit 100 may include an amplifier 102 which may receive, at a first input (e.g., the "positive" input), the voltage input Vin to the transconductance circuit 100. In some embodiments, the voltage input Vin may be a reference voltage provided by other circuitry (not shown). The first input of the amplifier 102 may be coupled to a capacitor 118 via a switch SC, and the capacitor 118 may be coupled to a current output Iout (which may have a polarity as indicated by the arrow of FIG. 1) via another switch SC. In some embodiments, the capacitor 118 may be a variable capacitor, as shown, and may serve as a programmable compensation capacitor to improve stability and drive capability. The two switches SC may be operated in tandem to control the participation of the capacitor 118 in the transconductance circuit 100 and thereby change the operational mode of the transconductance circuit 100 (e.g., to support the driving of current from the current output Iout to a load, not shown, having a high inductance).

The transconductance circuit 100 may also include one or more current cells 104, with individual current cells 104 coupled between the current output Iout and ground. FIG. 1 illustrates N of these current cells 104, labeled 104-1, ..., 104-N, and a transconductance circuit 100 may include any suitable number N of the current cells 104. In some embodiments, for example, a transconductance circuit 100 may include 32 or more current cells 104, 64 or more current cells 104, or 128 or more current cells 104. The number N of current cells 104 included in a transconductance circuit 100 may represent the number of selectable output current levels for the transconductance circuit 100; for example, a transconductance circuit 100 that includes 128 current cells may allow a user to select the desired output current for the transconductance circuit 100 from 128 levels between zero current and a maximum current (e.g., 128 milliamperes). In some embodiments, a single current cell 104 may be able to contribute a known output current I0 to the current output Iout; if the desired output current is K*I0, then K of the current cells 104 may be configured to participate in the operation of the transconductance circuit 100, as described below.

Individual current cells 104 may include a transistor 106 (e.g., an N-type metal oxide semiconductor (NMOS) transistor) and a resistor 108, with the transistor 106 coupled between the current output Iout and the resistor 108, and the resistor 108 coupled between the transistor 106 and ground. In particular, the resistor 108 may be coupled between ground and a source/drain V3 of the transistor 106. For an individual current cell 104, the gate of the transistor 106 may be coupled to the output V1 of the amplifier 102 via an associated switch S1, and the source/drain V3 of the transistor 106 may be coupled to a second input V2 of the amplifier 102 (e.g., the "negative" input) via an associated switch S2. The transconductance circuit 100 of FIG. 1 may also include a switch S3 between the output V1 of the amplifier 102 and the second input V2 of the amplifier 102, providing a feedback path around the amplifier 102.

Figure 2:
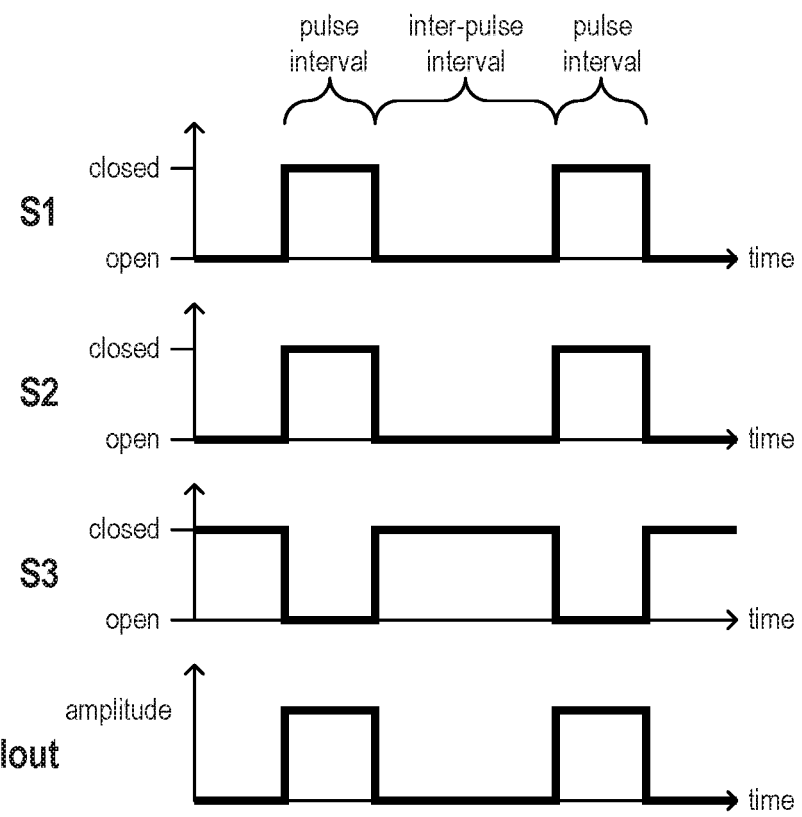
FIG. 2 is a timing diagram illustrating example operations in the generation of current pulses by the transconductance circuit of FIG. 1, in accordance with various embodiments.

FIG. 2 is a timing diagram illustrating example operations in the generation of current pulses at the current output Iout by the transconductance circuit 100 of FIG. 1, in accordance with various embodiments. In particular, FIG. 2 illustrates the timing of the opening and closing of the switches S1, S2, and S3 in the transconductance circuit 100 so that the transconductance circuit 100 outputs a series of current pulses at the current output Iout. The amplitude of the current pulses may depend on the control of the switches SC and the capacitance of the capacitor 118, as discussed above, and may also depend on the number of current cells 104 selected to participate in the operation of the transconductance circuit 100. In particular, the operation of the switches S1 and S2 associated with a particular current cell 104 may be as shown in FIG. 2 for current cells 104 selected to participate in the operation of the transconductance circuit 100; for current cells 104 not participating in the operation of the transconductance circuit 100 (e.g., when the desired magnitude of the current output from the current output Iout is less than the maximum achievable output current), the switches S1 and S2 associated with those current cells 104 may remain open, and the gates of the transistors 106 of those current cells 104 may be tied to ground.

As illustrated in FIG. 2, to generate a current pulse (over a pulse interval) at the current output Iout, the switches S1 and S2 associated with a participating current cell 104 may be closed, and the switch S3 may be opened. To cease the generation of a current pulse (over an inter-pulse interval) at the current output Iout, the switches S1 and S2 associated with a participating current cell 104 may be opened, and the switch S3 may be closed. Thus, during such operation of the transconductance circuit 100, the open/closed status of the switches S1 and S2 may be opposite to the open/closed status of the switch S3.

The operation of the switches S1, S2, and S3 of the transconductance circuit 100 of FIG. 1, in accordance with the timing diagram of FIG. 2, may sense and control the feedback loop around the amplifier 102; this feedback loop connects the gates of the transistors 106 to the amplifier 102, and thereby controllably converts the voltage input Vin to a wide range of output currents at the current output Iout.

Figure 3:
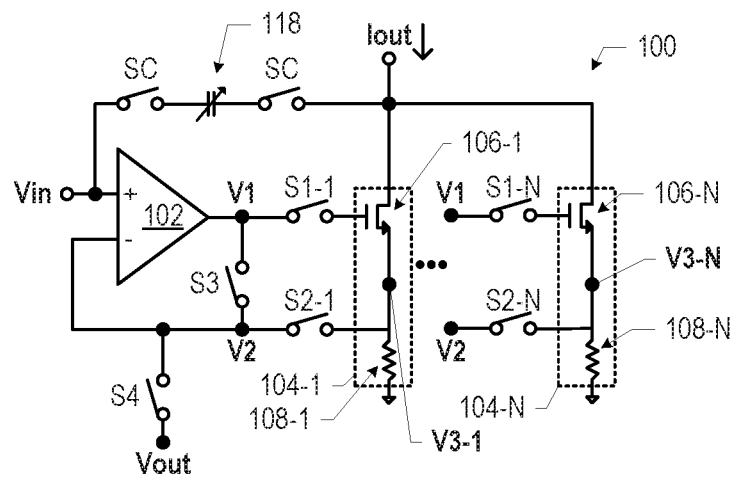
FIG. 3 is a schematic of another example transconductance circuit, in accordance with various embodiments.

FIG. 3 is a schematic of another example transconductance circuit 100, in accordance with various embodiments. The transconductance circuit 100 of FIG. 3 shares many elements with the transconductance circuit 100 of FIG. 1; for clarity, a discussion of these elements is not repeated, and these elements may take the form of any of the embodiments disclosed herein. The transconductance circuit 100 of FIG. 3 further includes a switch S4 coupled between the second input V2 of the amplifier 102 and a voltage output Vout of the transconductance circuit 100. The voltage at the voltage output Vout of the transconductance circuit 100 of FIG. 3 may be correlated with the current output at the current output Iout of the transconductance circuit 100, and thus noise appearing at the current output Iout of the transconductance circuit 100 may also appear at the voltage output Vout. Consequently, monitoring both the voltage output Vout and the current output Iout may allow the noise in the current output Iout to be corrected for; examples of such embodiments are discussed further below with reference to FIGS. 5 and 6.

Figure 4:
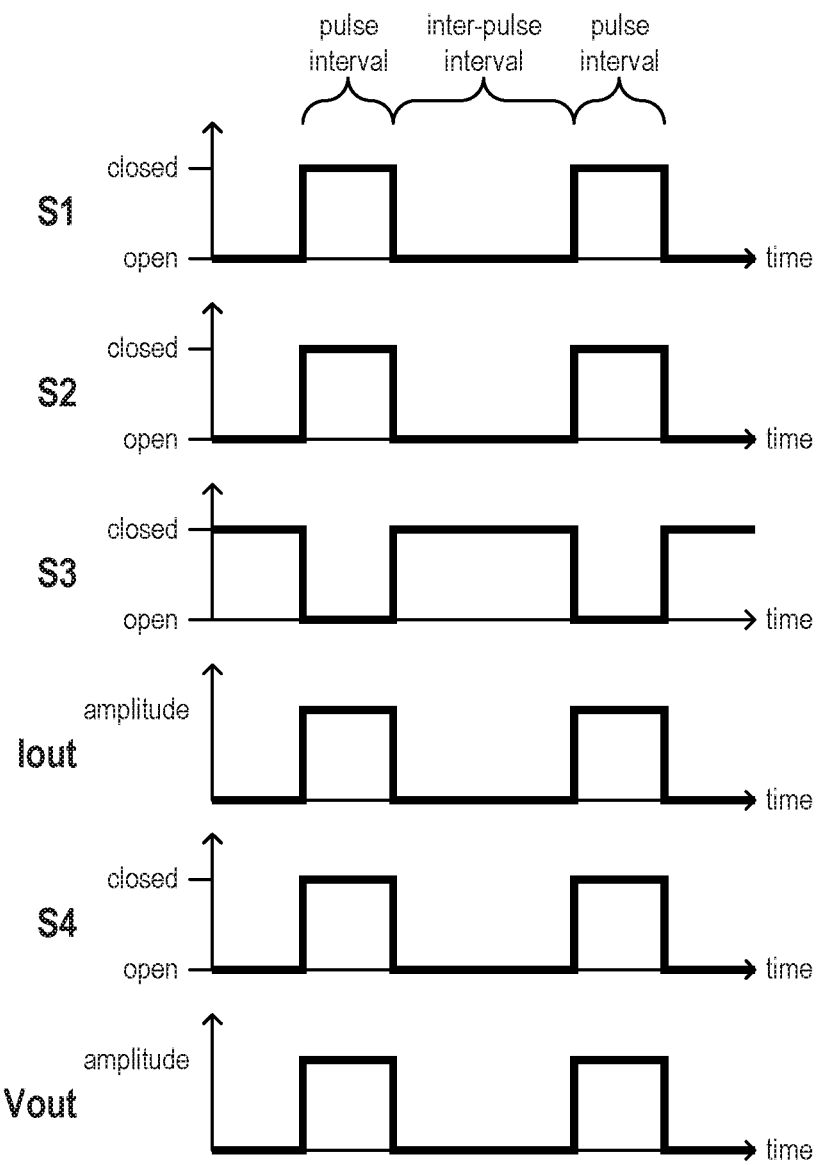
FIG. 4 is a timing diagram illustrating example operations in the generation of current pulses by the transconductance circuit of FIG. 3, in accordance with various embodiments.

FIG. 4 is a timing diagram illustrating example operations in the generation of current pulses at the current output Iout by the transconductance circuit 100 of FIG. 3, in accordance with various embodiments. The timing diagram of FIG. 4 shares many features with the timing diagram of FIG. 2; for clarity, a discussion of these features is not repeated. In particular, FIG. 4 illustrates an example timing of the opening and closing of the switch S4, which may be closed during a pulse interval and open during an inter-pulse interval. Thus, during such operation of the transconductance circuit 100 of FIG. 3, the open/close status of the switch S4 may be opposite to the open/close status of the switch S3. As shown, during a pulse interval, a corresponding voltage pulse may appear at the voltage output Vout (correlated with the pulse at the current output Iout), and may cease during the inter-pulse interval. Noise and other artifacts present at the current output Iout during the pulse intervals and during the inter-pulse intervals may have correlated counterparts at the voltage output Vout during the pulse intervals and during the inter-pulse intervals.

Figure 5:
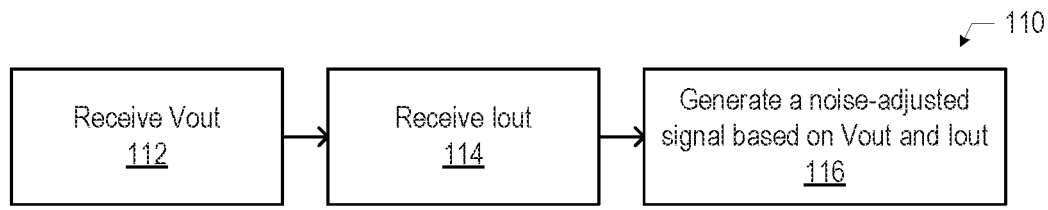
FIG. 5 is a flow diagram of an example method of generating a noise-adjusted signal from outputs of a transconductance circuit, in accordance with various embodiments.

As noted above, the correlated outputs Iout and Vout of the transconductance circuit 100 of FIG. 3 may be utilized to generate a noise-adjusted signal. FIG. 5 is a flow diagram of an example method 110 of generating a noise-adjusted signal from outputs of a transconductance circuit, in accordance with various embodiments. Although the operations of the method 110 may be illustrated with reference to particular embodiments of the transconductance circuits 100 disclosed herein, the method 110 may be performed using any suitable circuitry operations are illustrated once each and in a particular order in FIG. 5, but the operations may be performed in parallel, reordered, and/or repeated as desired.

At 112, a voltage output Vout may be received. For example, monitoring circuitry may monitor, at a first channel, a voltage signal at the voltage output Vout of the transconductance circuit 100 of FIG. 3. In some embodiments, this monitoring circuitry (e.g., monitoring circuitry 160 of FIG. 6) may be part of a photometric front end 150, as discussed below with reference to FIG. 6. The voltage signal at the voltage output Vout may reflect the noise in the transconductance circuit 100, including noise from the voltage input Vin and noise from the amplifier 102. When received, the voltage output Vout may be multiplied by a first channel gain Gain1.

At 114, a current output Iout may be received. For example, monitoring circuitry may monitor, at a second channel, a current signal at the current output Iout of the transconductance circuit 100 of FIG. 3. The current output Iout may be equal to the voltage output Vout divided by an equivalent resistance Req, which may be equal to the resistance between ground and the second input V2 of the amplifier 102. The equivalent resistance Req may also be equal to a cell resistance Rcell divided by the number of "participating" current cells 104, with the cell resistance Rcell equal to the resistance of the resistor 108. The relationship between the current output Iout and the voltage output Vout demonstrates that the noise in the transconductance circuit 100 that is reflected in Iout will also be reflected in Vout. Further, any pulse width noise (arising, e.g., from jitter noise of the clock source used for timing) may be the same in the current pulses at the current output Iout and in the voltage pulses at the voltage output Vout. When received, the current output Iout may be multiplied by a second channel gain Gain2.

At 116, a noise-adjusted signal may be generated based on the voltage output Vout (received at 112) and the current output Iout (received at 114). For example, monitoring circuitry may calculate a ratio of the signals monitored at the first and second channels, ratio=(Iout*Gain1)/(Vout*Gain2); in this ratio, the correlated noise in the current output Iout and the voltage output Vout may be canceled, and thus the ratio may represent a noise-adjusted signal that can be processed further as desired.

Figure 6:
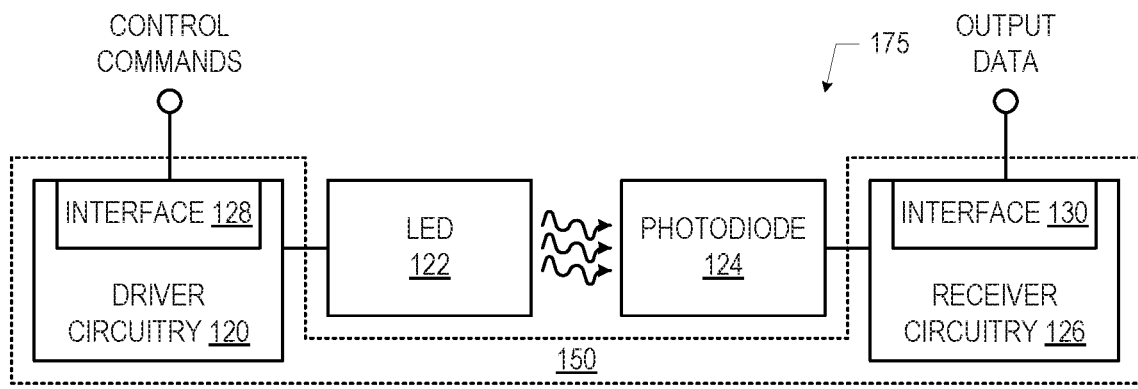
FIG. 6 is a block diagram of an example photometric system that may include any of the transconductance circuits disclosed herein.
Figure 7:
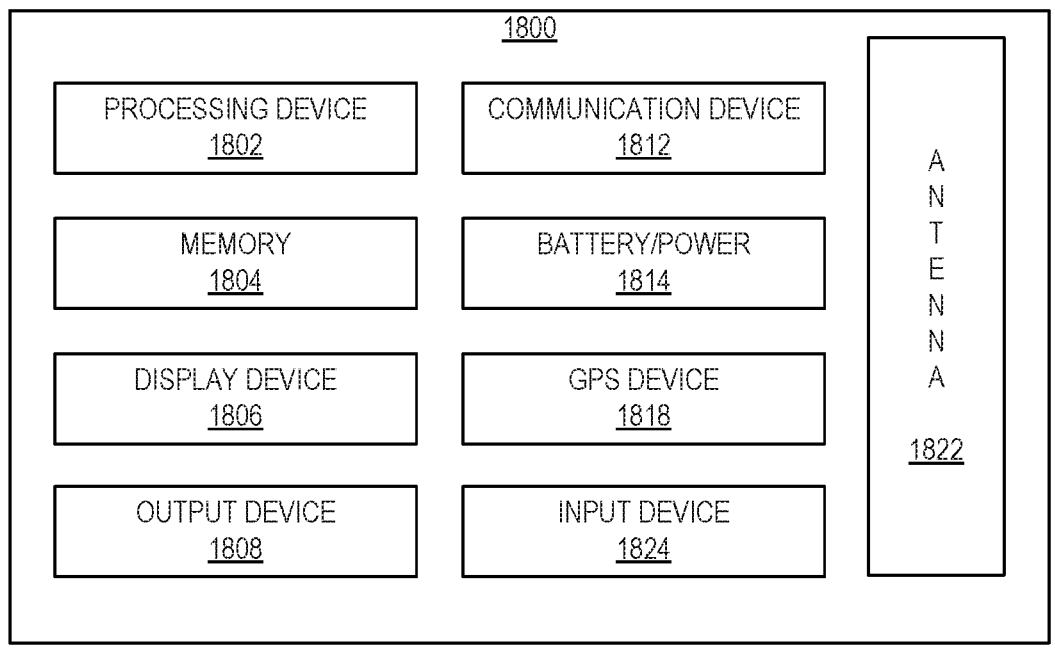
FIG. 7 is a block diagram of an example electrical device that may include any of the transconductance circuits disclosed herein.

The transconductance circuits 100 disclosed herein may be included in any suitable component or system of components. FIGS. 6-7 illustrate various examples of apparatuses that may include any of the transconductance circuits 100 disclosed herein.

FIG. 6 is a block diagram of an example photometric system 175 that may include any of the transconductance circuits 100 disclosed herein. The photometric system 175 may include a photometric front end 150 having driver circuitry 120 and receiver circuitry 126. In some embodiments, the photometric front end 150 may be a single apparatus that includes both the driver circuitry 120 and the receiver circuitry 126, while in other embodiments, different apparatuses may include the driver circuitry 120 and the receiver circuitry 126, respectively. The driver circuitry 120 may generate a drive signal for an LED 122; in some embodiments, the driver circuitry 120 may include any of the transconductance circuits 100 disclosed herein, with the current output Iout providing the drive signal to the LED 122. The driver circuitry 120 may include an interface 128 through which control commands may be received to configure the driver circuitry 120. For example, in some embodiments, the interface 128 may receive a command that indicates the desired magnitude of the current pulses to be generated at the current output Iout by the transconductance circuit 100 (e.g., by receiving M bits of data to specify which of 2^M current levels should be output).

The drive signal from the driver circuitry 120 may cause the LED 122 to emit light, and this light may be detected by a photodiode 124. The photodiode 124 may be coupled to the receiver circuitry 126, and the receiver circuitry 126 may receive the electrical signals generated by the photodiode 124 in response to the detected light. The receiver circuitry 126 may include an interface 130 through which output data may be provided. This output data may include data representative of the received electrical signals from the photodiode 124, and may also include data representative of the drive signal provided to the LED 122 (e.g., when the driver circuitry 120 is in communication with the receiver circuitry 126). In some embodiments, the output data may include a noise-adjusted signal, such as the noise-adjusted signal discussed above with reference to the method 110; in some such embodiments, the photometric front end 150 (e.g., the receiver circuitry 126) may perform the method 110. Although FIG. 6 depicts a single LED 122 and a single photodiode 124, this is simply for ease of illustration, and a photometric system 175 may include any desired number of LEDs 122 and photodiodes 124.

In some embodiments, the photometric system 175 may be part of a vital signs monitoring (VSM) system. For example, the photometric system 175 may be part of a photoplethysmograph (PPG) system in which the LED 122 and the photodiode 124 are positioned proximate to a patient's tissue so that the photodiode 124 may detect light, emitted by the LED 122, that has been transmitted through and/or reflected from the tissue; information about the tissue (e.g., the oxygen content of the tissue) may be derived from such data, as known in the art.

FIG. 7 is a block diagram of an example electrical device 1800 that may include any of the transconductance circuits 100 disclosed herein, or may include one or more components that perform any of the methods 110 disclosed herein. For example, the output device(s) 1808 of the electrical device 1800 may include one or more LEDs 122 and associated driver circuitry 120, and the driver circuitry 120 may include any of the transconductance circuits 100 disclosed herein or the driver circuitry 120 may perform any of the methods 110 disclosed herein. In some embodiments, the electrical device 1800 may include the photometric front end 150 and/or the photometric system 175 of FIG. 6. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components may be fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an input device 1824 or an output device 1808, but may include audio input or output device interface circuitry (e.g., connectors and supporting circuitry) to which an input device 1824 or output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication device 1812 (e.g., one or more communication devices). For example, the communication device 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication device 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication device 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication device 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication device 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication device 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication device 1812 may manage wired communications, such as electrical, optical, or any other suitable communication protocols (e.g., the Ethernet). As noted above, the communication device 1812 may include multiple communication devices. For instance, a first communication device 1812 may be dedicated to shorter-range wireless communications such as Wi-Fi or Bluetooth, and a second communication device 1812 may be dedicated to longer-range wireless communications such as global positioning system (GPS), EDGE, GPRS, CDMA, WiMAX, LTE, EV-DO, or others. In some embodiments, a first communication device 1812 may be dedicated to wireless communications, and a second communication device 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), an LED display, or a flat panel display.

The electrical device 1800 may include one or more output devices 1808 (or corresponding interface circuitry, as discussed above). In some embodiments, the output device 1808 may include one or more LEDs 122 and driver circuitry 120, as discussed above with reference to FIG. 6. In some embodiments, the output device 1808 may include an audio codec, a video codec, a printer, a wired or wireless transmitter for providing information to other devices, or an additional storage device. In some embodiments, the output device 1808 may include any device that generates an audible indicator, such as speakers, headsets, or earbuds.

The electrical device 1800 may include one or more input devices 1824 (or corresponding interface circuitry, as discussed above). In some embodiments, the input device 1824 may include one or more photodiodes 124 and receiver circuitry 126, as discussed above with reference to FIG. 6. Examples of the input devices 1824 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader. In some embodiments, the input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a transconductance circuit, including an amplifier having a first input coupled to a voltage input of the transconductance circuit; and a switch coupled between an output of the amplifier and a second input of the amplifier.

Example 2 includes the subject matter of Example 1, and further includes: one or more current cells, wherein an individual switch is coupled between the output of the amplifier and a gate of a transistor of an associated individual current cell.

Example 3 includes the subject matter of Example 2, and further specifies that an individual switch is coupled between the second input of the amplifier and a source/drain of the transistor of the associated individual current cell.

Example 4 includes the subject matter of any of Examples 2-3, and further specifies that the transconductance circuit includes more than 32 current cells.

Example 5 includes the subject matter of any of Examples 2-4, and further specifies that individual current cells are coupled between ground and a current output of the transconductance circuit.

Example 6 includes the subject matter of any of Examples 1-5, and further includes: a switch coupled between a capacitor and the first input of the amplifier; and a switch coupled between the capacitor and a current output of the transconductance circuit.

Example 7 includes the subject matter of Example 6, and further specifies that the capacitor includes a variable capacitor.

Example 8 includes the subject matter of any of Examples 1-7, and further includes: a switch coupled between the second input of the amplifier and a voltage output of the transconductance circuit.

Example 9 is a photometric system, including light-emitting diode (LED) driver circuitry, wherein the LED driver circuitry includes a transconductance circuit, the transconductance circuit includes an amplifier and a switch, and the switch is coupled between an output of the amplifier and an input of the amplifier.

Example 10 includes the subject matter of Example 9, and further includes: photodiode receiver circuitry, wherein the photodiode receiver circuitry is to couple to a photodiode to receive electrical signals generated by the photodiode.

Example 11 includes the subject matter of Example 10, and further specifies that the LED driver circuitry and the photodiode receiver circuitry are part of a single apparatus.

Example 12 includes the subject matter of any of Examples 10-11, and further includes: the photodiode, wherein the photodiode is coupled to the photodiode receiver circuitry.

Example 13 includes the subject matter of any of Examples 9-12, and further includes: an LED coupled to the LED driver circuitry.

Example 14 includes the subject matter of any of Examples 9-13, and further specifies that the LED driver circuitry includes an interface to receive a command indicative of a desired magnitude of current to be output from the LED driver circuitry to an LED.

Example 15 includes the subject matter of Example 14, and further specifies that the command includes a specification of one of at least 64 levels of current magnitude.

Example 16 includes the subject matter of any of Examples 14-15, and further specifies that the photometric system is to output a ratio of (1) a first value representative of a magnitude of current output from the LED driver circuitry to an LED and (2) a second value representative of a magnitude of voltage output from a transconductance circuit in the LED driver circuitry.

Example 17 is a method of operating a transconductance circuit, including: during an inter-pulse interval, causing a switch to close, wherein the switch is coupled between an output of an amplifier and an input of the amplifier; and during a pulse interval, causing the switch to open.

Example 18 includes the subject matter of Example 17, and further specifies that the switch is a first switch and the method further includes: during an inter-pulse interval, causing a second switch and a third switch to open, wherein the second switch is coupled between the output of an amplifier and a gate of a transistor of a current cell, and the third switch is coupled between the input to the amplifier and a source/drain of the transistor of the current cell; and during a pulse interval, causing the second switch and the third switch to close.

Example 19 includes the subject matter of any of Examples 17-18, and further specifies that the switch is a first switch and the method further includes: during an inter-pulse interval, causing a fourth switch to open, wherein the fourth switch is coupled between the input to the amplifier and a voltage output of the transconductance circuit; and during a pulse interval, causing the fourth switch to close.

Example 20 includes the subject matter of any of Examples 17-19, and further specifies that a current pulse is output by the transconductance circuit during the pulse interval, and a current pulse is not output by the transconductance circuit during the inter-pulse interval.

The invention claimed is:

1. A transconductance circuit, comprising:
   an amplifier having a first input coupled to a voltage input of the transconductance circuit;
   a first switch coupled between an output of the amplifier and a gate of a transistor of a first current cell;
   a second switch coupled between a second input of the amplifier and a source/drain of the transistor of the first current cell;
   a third switch coupled between the output of the amplifier and the second input of the amplifier;
   a fourth switch coupled between the second input of the amplifier and a voltage output of the transconductance circuit, wherein the first, second, and fourth switches are closed and the third switch is opened during a first interval, and wherein the first, second, and fourth switches are opened and the third switch is closed during a second interval;
   a fifth switch, different from the third switch, coupled between a variable capacitor and the first input of the amplifier; and
   a sixth switch, different from the third switch and different from the fifth switch, coupled between the variable capacitor and a current output of the transconductance circuit, wherein the fifth switch, the variable capacitor, and the sixth switch control amplitudes of current at the current output of the transconductance circuit based at least in part on a voltage at the voltage input of the transconductance circuit.

2. The transconductance circuit of claim 1, further comprising:
   one or more current cells, wherein an individual switch is coupled between the output of the amplifier and a gate of a transistor of an associated individual current cell, wherein the first current cell corresponds to an individual current cell of the one or more current cells.

3. The transconductance circuit of claim 2, wherein an individual switch is coupled between the second input of the amplifier and a source/drain of the transistor of the associated individual current cell.

4. The transconductance circuit of claim 2, wherein the transconductance circuit includes more than 32 current cells.

5. The transconductance circuit of claim 2, wherein individual current cells are coupled between ground and the current output of the transconductance circuit.

6. A method of operating a transconductance circuit, comprising:
    during an inter-pulse interval in which the transconductance circuit is not to output a current pulse:
        causing a third switch to close, wherein the third switch is coupled between an output of an amplifier and an input of the amplifier;
        causing a first switch and a second switch to open, wherein the first switch is coupled between the output of the amplifier and a gate of a transistor of a current cell, and the second switch is coupled between the input to the amplifier and a source/drain of the transistor of the current cell; and
        causing a fourth switch to open, wherein the fourth switch is coupled between the input to the amplifier and a voltage output of the transconductance circuit; and
    during a pulse interval in which the transconductance circuit is to output a current pulse:
        causing the third switch to open;
        causing the first switch and the second switch to close, wherein the causing the first switch and the second switch to close causes the transconductance circuit to generate the output current pulse;
        causing the fourth switch to close;
        monitoring a current at a current output of the current cell and a voltage at the voltage output while the first, second, and fourth switches are closed and the third switch is opened; and
        controlling a fifth switch, a variable capacitor, and a sixth switch to control an amplitude of the output current pulse, wherein the fifth switch is coupled between the variable capacitor and another input of the amplifier, and wherein the sixth switch is coupled between the variable capacitor and a current output of the transconductance circuit that provides the output current pulse.

7. The method of claim 6, further comprising:
    correlating the current and the voltage to generate a noise-adjusted signal.

8. The method of claim 6, further comprising:
    multiplying the current by a first gain; and
    multiplying the voltage by a second gain.

9. The method of claim 6, further comprising:
    calculating a ratio of the current multiplied by a first gain and the voltage multiplied by a second gain.

10. The method of claim 6, wherein the causing the first switch and the second switch to close during the pulse interval is based on the first switch and the second switch operate opposite to an open/close status of the third switch to provide the output current pulse, and wherein the causing the fourth switch to close during the pulse interval is based on the fourth switch operate opposite to the open/close status of the third switch to provide a voltage pulse at the voltage output of the transconductance circuit.

11. The transconductance circuit of claim 1, wherein the fifth switch and the sixth switch open at the same time to disconnect the variable capacitor from the first input of the amplifier and from the current output of the transconductance circuit, and wherein the fifth switch and the sixth switch close at the same time to connect the variable capacitor between the first input of the amplifier and the current output of the transconductance circuit.

12. The transconductance circuit of claim 2, wherein a number of the one or more current cells is associated with a number of selectable output current levels for the transconductance circuit.

13. The transconductance circuit of claim 12, wherein the number of selectable output current levels for the transconductance circuit is at least 64.

14. The transconductance circuit of claim 1, wherein the variable capacitor is a programmable capacitor.

15. The transconductance circuit of claim 1, wherein the transistor is an N-type metal oxide semiconductor (NMOS).

16. The method of claim 6, further comprising: selecting a current level for the current pulse from a number of selectable output current levels for the transconductance circuit.

17. The method of claim 16, wherein the number of selectable output current levels for the transconductance circuit is at least 64.

18. The method of claim 6, wherein the controlling the fifth switch, the variable capacitor, and the sixth switch is based on an operational mode.

19. The method of claim 6, wherein the controlling the fifth switch, the variable capacitor, and the sixth switch is based on a load coupled to the current output.

20. The method of claim 6, further comprising: driving, using the current pulse output during the pulse interval, a light-emitting diode (LED).

* * * * *